(12) United States Patent
Kim et al.

(10) Patent No.: US 12,130,979 B2
(45) Date of Patent: Oct. 29, 2024

(54) CIRCUIT BOARD AND DISPLAY DEVICE INCLUDING THE SAME

(71) Applicant: Samsung Display Co., Ltd., Yongin-Si (KR)

(72) Inventors: Min-Hong Kim, Hwaseong-si (KR); Hyun-Wook Cho, Seongnam-si (KR); Taejoon Kim, Seongnam-si (KR); Jaehyun Park, Seoul (KR); Jungmok Park, Hwaseong-si (KR); Bogeun Yuk, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 528 days.

(21) Appl. No.: 17/242,717

(22) Filed: Apr. 28, 2021

(65) Prior Publication Data

US 2022/0011918 A1     Jan. 13, 2022

(30) Foreign Application Priority Data

Jul. 10, 2020    (KR) ........................ 10-2020-0085730

(51) Int. Cl.
     *G06F 3/041*      (2006.01)
     *H05K 1/18*      (2006.01)
     *H01R 12/52*      (2011.01)

(52) U.S. Cl.
     CPC ........ *G06F 3/04164* (2019.05); *G06F 3/0412* (2013.01); *H05K 1/181* (2013.01); *H01R 12/52* (2013.01); *H05K 2201/10128* (2013.01); *H05K 2201/10378* (2013.01); *H05K 2201/10515* (2013.01); *H05K 2201/10522* (2013.01); *H05K 2201/1053* (2013.01)

(58) Field of Classification Search
None
See application file for complete search history.

(56) References Cited

U.S. PATENT DOCUMENTS

| | | | |
|---|---|---|---|
| 8,947,370 B2* | 2/2015 | An | G06F 3/0446 345/173 |
| 11,262,866 B2* | 3/2022 | Ku | H10K 77/111 |
| 11,669,196 B2* | 6/2023 | Ku | H10K 77/111 345/161 |
| 2016/0291776 A1* | 10/2016 | Li | G06F 3/04164 |
| 2017/0131816 A1* | 5/2017 | Zou | G06F 3/0448 |

(Continued)

FOREIGN PATENT DOCUMENTS

| | | |
|---|---|---|
| KR | 101025171 B1 | 4/2011 |
| KR | 1020180119196 A | 11/2018 |

(Continued)

*Primary Examiner* — Fred Tzeng
(74) *Attorney, Agent, or Firm* — CANTOR COLBURN LLP

(57) ABSTRACT

A circuit board includes a base substrate, and a connection structure disposed on the base substrate, and connected to the base substrate by an accessing part. The connection structure includes a first connection electrode, a second connection electrode disposed in a same layer as the first connection electrode, a third connection electrode connected to the first connection electrode on the first connection electrode, and a fourth connection electrode connected to the second connection electrode on the second connection electrode, and disposed in a same layer as the third connection electrode.

16 Claims, 10 Drawing Sheets

(56) References Cited

U.S. PATENT DOCUMENTS

| | | | |
|---|---|---|---|
| 2022/0319422 A1* | 10/2022 | Li | G09G 3/3233 |
| 2022/0326813 A1* | 10/2022 | Lee | H10K 59/40 |
| 2022/0328599 A1* | 10/2022 | Zhang | G06F 3/044 |
| 2022/0342528 A1* | 10/2022 | Niu | H10K 59/40 |
| 2022/0393070 A1* | 12/2022 | Bok | H01L 33/387 |
| 2023/0006026 A1* | 1/2023 | Kim | G02F 1/136286 |
| 2023/0006103 A1* | 1/2023 | Kwag | H01L 33/38 |

FOREIGN PATENT DOCUMENTS

| | | |
|---|---|---|
| KR | 1020190008495 A | 1/2019 |
| KR | 102056671 B1 | 12/2019 |
| KR | 1020200034052 A | 3/2020 |

\* cited by examiner

CIRCUIT BOARD AND DISPLAY DEVICE INCLUDING THE SAME

This application claims priority to Korean Patent Application No. 10-2020-0085730, filed on Jul. 10, 2020, and all the benefits accruing therefrom under 35 U.S.C. § 119, the content of which in its entirety is herein incorporated by reference.

BACKGROUND

1. Field

Embodiments of the invention relate to a circuit board and a display device including the circuit board. More particularly, embodiments of the invention relate to a circuit board including a touch driver and a display device including the circuit board.

2. Description of the Related Art

Recently, an interest in display devices is increasing. Accordingly, display devices are being manufactured in various types, including organic light emitting display device and liquid crystal display device.

The display device may include a touch sensor. The touch sensor may be attached to one surface of a display panel or may be unitarily manufactured with the display panel. The touch sensor may be connected to a touch driver through touch lines. The touch driver may be disposed on a circuit board (e.g., a flexible printed circuit board). The circuit board may include a plurality of lines. High voltage and high frequency signals may flow through the plurality of lines.

SUMMARY

When touch lines overlap a plurality of lines, problems (e.g., a coupling phenomenon, ghost touch, etc.) may occur due to interference between the lines.

Embodiments of the invention provide a circuit board including a touch driver.

Embodiments of the invention also provide a display device including the circuit board.

According to embodiment of the circuit board may include a base substrate and a connection structure disposed on the base substrate, and connected to the base substrate by an accessing part. The connection structure may include a first connection electrode, a second connection electrode disposed in a same layer as the first connection electrode, a third connection electrode connected to the first connection electrode on the first connection electrode, and a fourth connection electrode connected to the second connection electrode on the second connection electrode, and disposed in a same layer as the third connection electrode.

In an embodiment, the accessing part may be connected to the base substrate by a surface mount technology.

In an embodiment, the accessing part may be connected to the base substrate by a solder.

In an embodiment, the accessing part may be connected to the base substrate by a connector.

In an embodiment, the accessing part may be connected to the base substrate by an anisotropic conductive film.

In an embodiment, the connection structure may further include a signal electrode disposed in a same layer as the first connection electrode.

In an embodiment, the first connection electrode and the second connection electrode may be connected to a touch sensing layer, and the signal electrode may be connected to a display panel.

In an embodiment, the connection structure may further include a fifth connection electrode disposed in a same layer as the first connection electrode, and connected to a central processor, and a sixth connection electrode connected to the fifth connection electrode on the fifth connection electrode.

In an embodiment, the circuit board may further include a touch driver disposed on the connection structure and connected to the connection structure.

In an embodiment, the circuit board may further include a touch driver disposed on the base substrate and connected to the connection structure.

In an embodiment, the connection structure may further include a shielding layer disposed between a layer on which the first connection electrode and the second connection electrode may be disposed and a layer on which the third connection electrode and the fourth connection electrode may be disposed.

According to embodiment of the display device may include a display structure, and a circuit board connected to the display structure. The circuit board may include a base substrate and a connection structure disposed on the base substrate, and connected to the base substrate by an accessing part. The connection structure may include a first connection electrode, a second connection electrode disposed in a same layer as the first connection electrode, a third connection electrode connected to the first connection electrode on the first connection electrode, and a fourth connection electrode connected to the second connection electrode on the second connection electrode, and disposed in a same layer as the third connection electrode.

In an embodiment, the display structure may further include a display substrate including a display area and a non-display area surrounding the display area, a display panel disposed on the display substrate, and a touch sensing layer disposed on the display panel, and including a sensor electrode.

In an embodiment, the touch sensing layer may be connected to the first connection electrode by a first touch line, and may be connected to the second connection electrode by a second touch line, and at least one of the first touch line and the second touch line may include a resistance value increasing portion, and the resistance value increasing portion has a meander shape.

In an embodiment, the connection structure may further include a fifth connection electrode disposed in a same layer as the first connection electrode, and a sixth connection electrode connected to the fifth connection electrode on the fifth connection electrode.

In an embodiment, the display device may further include a central processor connected to the circuit board, and the central processor may be connected to the fifth connection electrode by a touch line.

In an embodiment, the accessing part may be connected to the base substrate by a surface mount technology.

In an embodiment, the accessing part may be connected to the base substrate by a solder.

In an embodiment, the accessing part may be connected to the base substrate by a connector.

In an embodiment, the accessing part may be connected to the base substrate by an anisotropic conductive film.

The display device in embodiments may include a connection structure included in a circuit board. Touch lines and signal lines may be disposed on the circuit board. The touch line may bypass the signal line and be connected to the touch driver through the connection structure.

Accordingly, it is not necessary to provide a separate circuit board to arrange the touch driver. Accordingly, the thickness of the display device may be reduced.

In addition, due to the connection structure, a portion where the signal line disposed on the circuit board and the touch line overlap may be minimized. Accordingly, interference caused to the touch line by the signal line may be minimized.

BRIEF DESCRIPTION OF THE DRAWINGS

The above and other features of the invention will become more apparent by describing in detailed embodiments thereof with reference to the accompanying drawings, in which.

DETAILED DESCRIPTION

Figure 1:
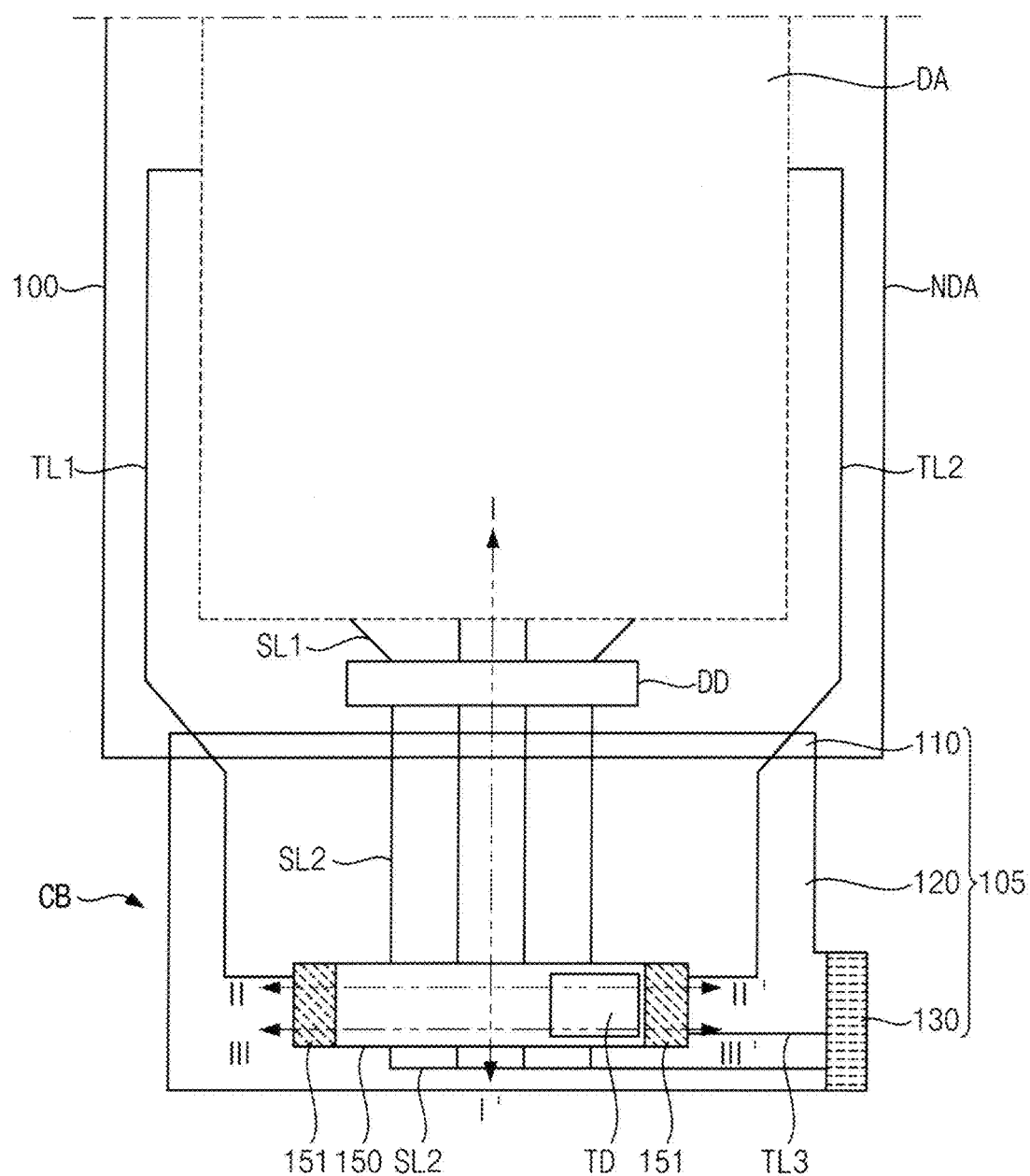
FIG. 1 is a plan view illustrating an embodiment of a display device according to the invention.

Hereinafter, embodiments of the invention will be described in detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
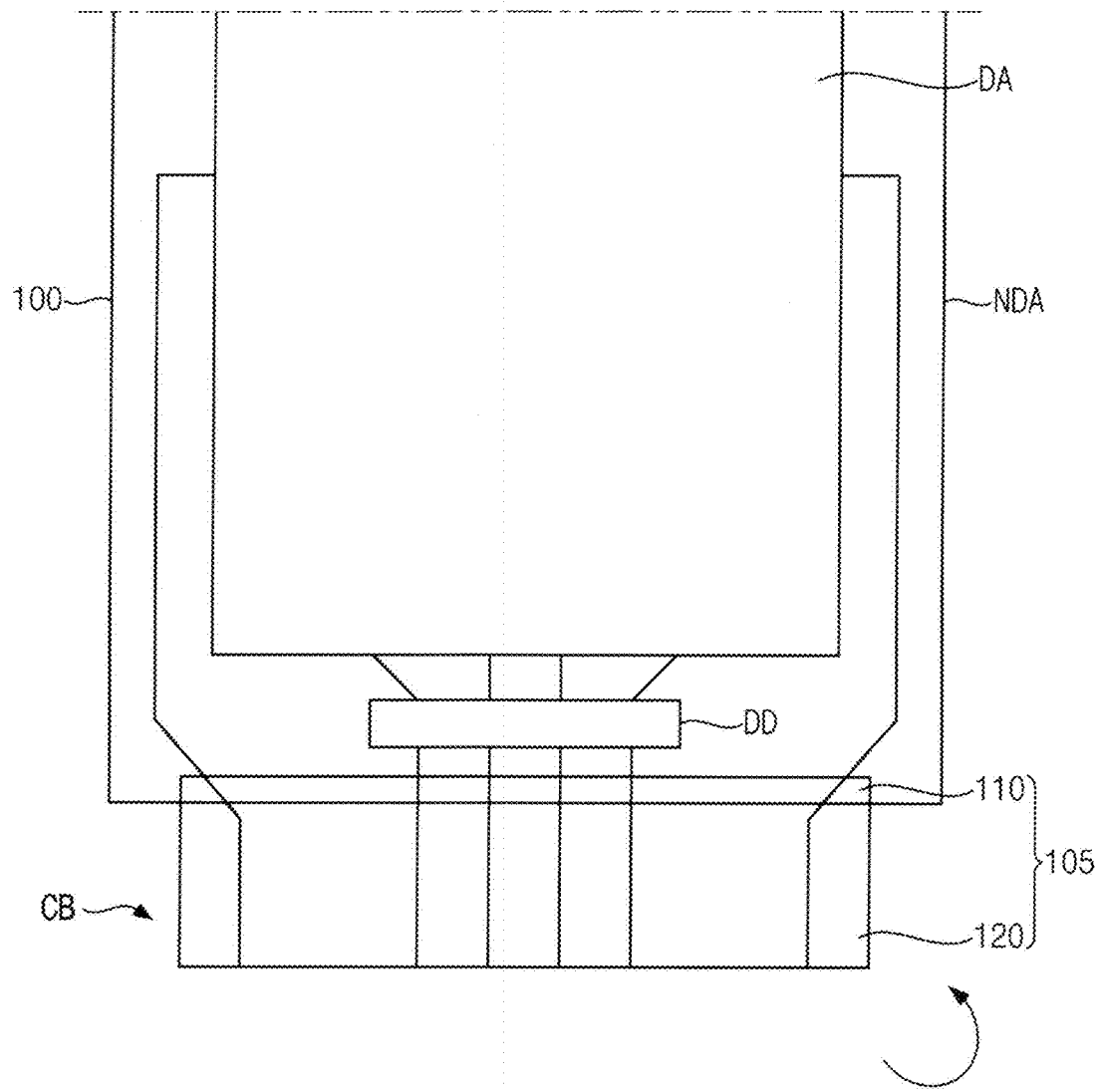
FIG. 2 is a plan view illustrating an embodiment in which the flexible printed circuit board of the display device of FIG. 1 is bent.
Figure 3:
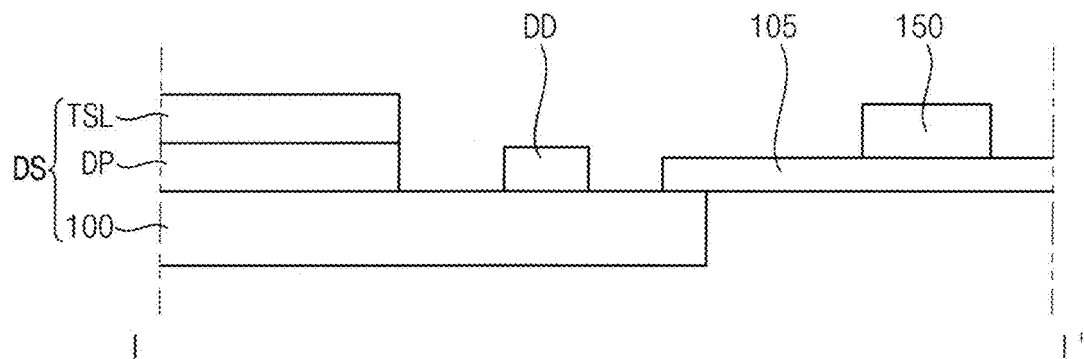
FIG. 3 is a cross-sectional view illustrating an embodiment of the display device of FIG. 1 taken along line I-I'.
Figure 4:
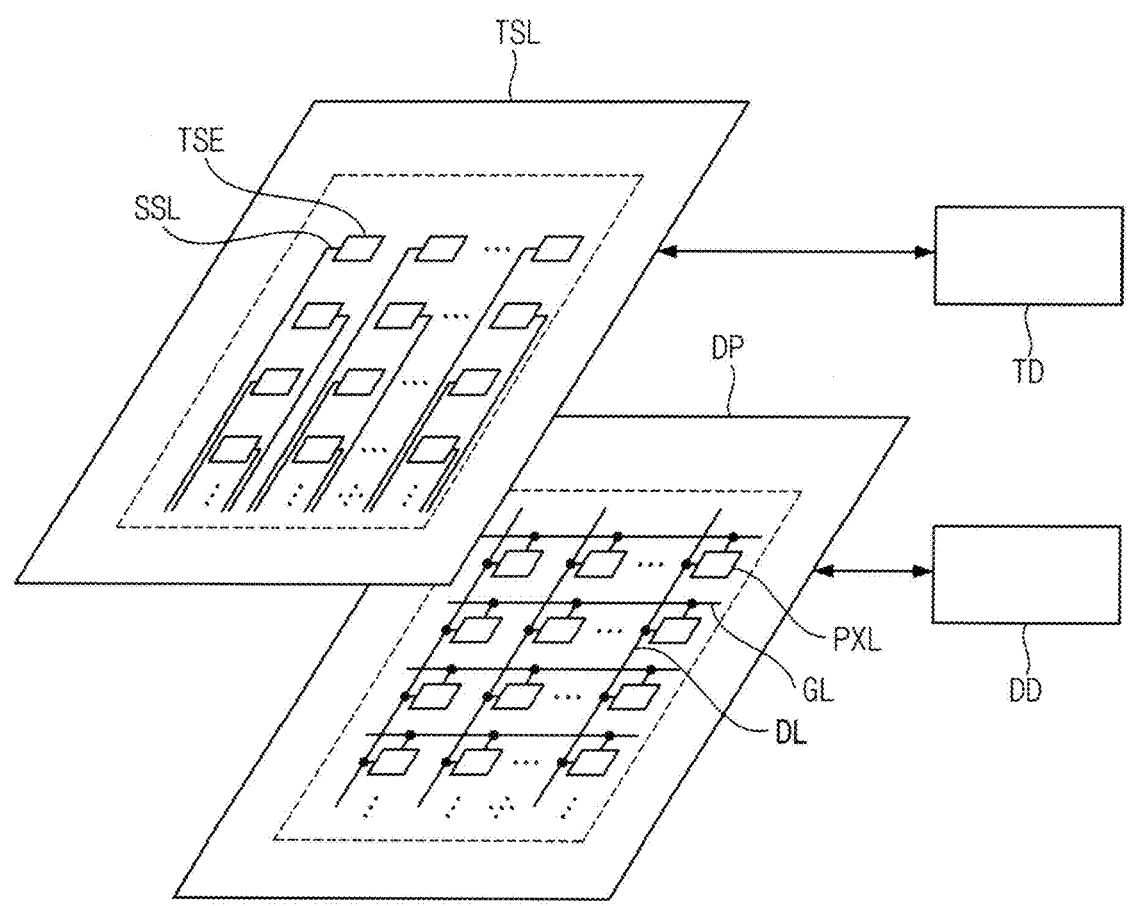
FIG. 4 is a diagram illustrating an embodiment of a touch sensing layer and a display panel included in the display device of FIG. 1.

FIG. 1 is a plan view illustrating an embodiment of a display device according to the invention, FIG. 2 is a plan view illustrating an embodiment in which the flexible printed circuit board of the display device of FIG. 1 is bent, FIG. 3 is a cross-sectional view illustrating an embodiment of the display device of FIG. 1 taken along line I-I', and FIG. 4 is a diagram illustrating an embodiment of a touch sensing layer and a display panel included in the display device of FIG. 1.

Referring to FIGS. 1 to 4, the display device may include a display structure DS, a display driver DD, a circuit board CB, and a touch driver TD. The display structure DS may include a display substrate 100, a display panel DP, and a touch sensing layer TSL. The circuit board CB may include a base substrate 105, and a connection structure 150.

The display substrate 100 may include a display area DA and non-display area NDA. The non-display area NDA may surround the display area DA. The display device may display an image or the like through the display area DA.

Various lines connected to the display area DA may be disposed in the non-display area NDA. In an embodiment, a first touch line TL1, a second touch line TL2, a first signal line SL1, and a second signal line SL2 may be disposed in the non-display area NDA, for example. Each of the first touch line TL1, the second touch line TL2, the first signal line SL1, and the second signal line SL2 may be plural.

The display panel DP may be disposed on the display substrate 100. The display panel DP may include a plurality of pixels PXL. The pixels PXL may be connected to a gate line GL and a data line DL. The gate line GL and the data line DL may be connected to the display driver DD by the first signal line SL1. The display driver DD may provide various signals for driving the pixels PXL to the pixels PXL.

The touch sensing layer TSL may be disposed on the display panel DP. FIGS. 3 and 4 illustrate that the touch sensing layer TSL is separated from the display panel DP, the invention is not limited thereto. In an embodiment, the touch sensing layer TSL may be unitarily manufactured with the display panel DP. The touch sensing layer TSL may include a plurality of sensor electrodes TSE, for example. The sensor electrodes TSE may be connected to the first touch line TL1 and the second touch line TL2 by sensor lines SSL. The touch sensing layer TSL may be connected to the touch driver TD by the first touch line TL1 and the second touch line TL2.

The touch driver TD may drive and sense the touch sensing layer TSL. In an embodiment, the touch driver TD may receive a touch sensing signal corresponding to the touch driving signal after supplying a signal to the touch sensing layer TSL.

In an embodiment, the touch sensing layer TSL may obtain information on coordinates of a touch input point in a capacitive method. In the capacitive method, information on the coordinates of a touched point may be obtained in a self-capacitance method or a mutual-capacitance method.

In an embodiment, the first touch line TL1 may transmit a change in capacitance according to a touch input to the touch driver TD. The second touch line TL2 may transmit the touch driving signal transmitted from the touch driver TD to the touch sensing layer TSL.

Figure 5:
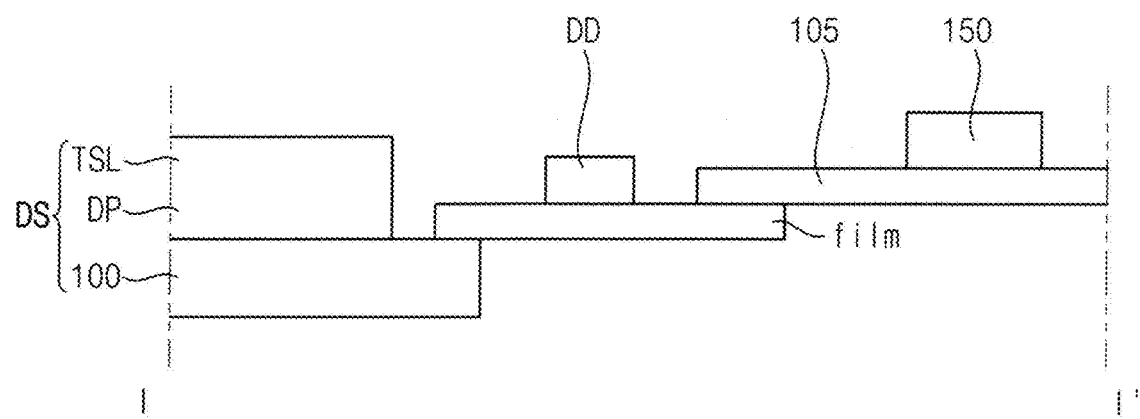
FIG. 5 is a cross-sectional view illustrating an embodiment of the display device of FIG. 1 taken along line I-I'.

Also, the display driver DD may be disposed in the non-display area NDA. The display driver DD may supply signals for driving the display area DA. In FIGS. 1 and 3, it is illustrated that the display driver DD is disposed (e.g., mounted) on the display substrate 100 in a chip on glass format, but the invention is not limited thereto. In an embodiment, as illustrated in FIG. 5, the display driver DD may be disposed (e.g., mounted) on a film attached to the display substrate 100 in a chip on film format, for example. In this case, the circuit board CB may be connected to the film.

The circuit board CB may be disposed on one side of the display substrate 100. In an embodiment, the circuit board CB may include a printed circuit board ("PCB"). In an alternative embodiment, the circuit board CB may include a flexible printed circuit board ("FPCB") having flexibility. In this case, the circuit board CB may be bent toward the bottom surface of the display substrate 100 as shown in FIG. 2.

The base substrate 105 may include a first connection part 110, an extension part 120, and a second connection part 130.

The circuit board CB may be disposed on one side of the display structure DS. The circuit board CB may be connected to the display structure DS. In an embodiment, the first touch line TL1, the second touch line TL2, and the second signal line SL2 may extend from the non-display area NDA to the circuit board CB, for example.

The circuit board CB may be connected to the display structure DS through the first connection part 110. In an embodiment, the first connection part 110 may include a plurality of pads (not shown), for example. The first touch line TL1, the second touch line TL2, and the second signal line SL2 may connect the display structure DS and the circuit board CB through the pads.

The first touch line TL1, the second touch line TL2, and the second signal line SL2 may extend in the extension part 120. In an embodiment, when the circuit board CB is the flexible printed circuit board ("FPCB"), the extension part 120 may be bent. Accordingly, the circuit board CB may be bent toward the bottom surface of the display substrate 100.

The connection structure 150 may be disposed on the extension part 120. The connection structure 150 may be electrically connected to the first touch line TL1 and the second touch line TL2 through an accessing part 151. In an embodiment, the accessing part 151 may connect the connection structure 150 to the first touch line TL1 and the second touch line TL2 using a surface mount technology. The first touch line TL1 and the second touch line TL2 may be connected to the touch driver TD through the connection structure 150. The second signal line SL2 may pass through the connection structure 150.

In an embodiment, the accessing part 151 may include solder. The accessing part 151 may connect the connection structure 150 to the first touch line TL1 and the second touch line TL2 by soldering the solder.

In an embodiment, the accessing part 151 may connect the connection structure 150 to the first touch line TL1 and the second touch line TL2 by an anisotropic conductive film.

In an embodiment, the accessing part 151 may connect the connection structure 150 to the first touch line TL1 and the second touch line TL2 by a connector.

However, the above descriptions are exemplary, and a method in which the accessing part 151 connects the connection structure 150 to the first touch line TL1 and the second touch line TL2 is not limited thereto.

An external device may be connected to the second connection part (also referred to as a second connector) 130. In an embodiment, the second connection part 130 may be connected to the external device (e.g., a central processor) by a connector. However, this is exemplary, and the second connection part 130 may be connected to the external device through various methods like the accessing part 151. In an embodiment, the second connection part 130 may be connected to the central processer by the anisotropic conductive film, for example. The central processer may provide signals transmitted to the display structure DS and receive signals from the display structure DS.

The third touch line TL3 may transmit a signal received from the external device to the touch driver TD. The second signal line SL2 may transmit a signal received from the external device to the display driver DD. The second signal line SL2 may pass through the connection structure 150. The first signal line SL1 may transmit a signal received from the display driver DD to the display panel DP. The first touch line TL1 may transmit a signal received from the touch sensing layer TSL to the touch driver TD. The second touch line TL2 may transmit a signal received from the touch driver TD to the touch sensing layer TSL.

Figure 6:
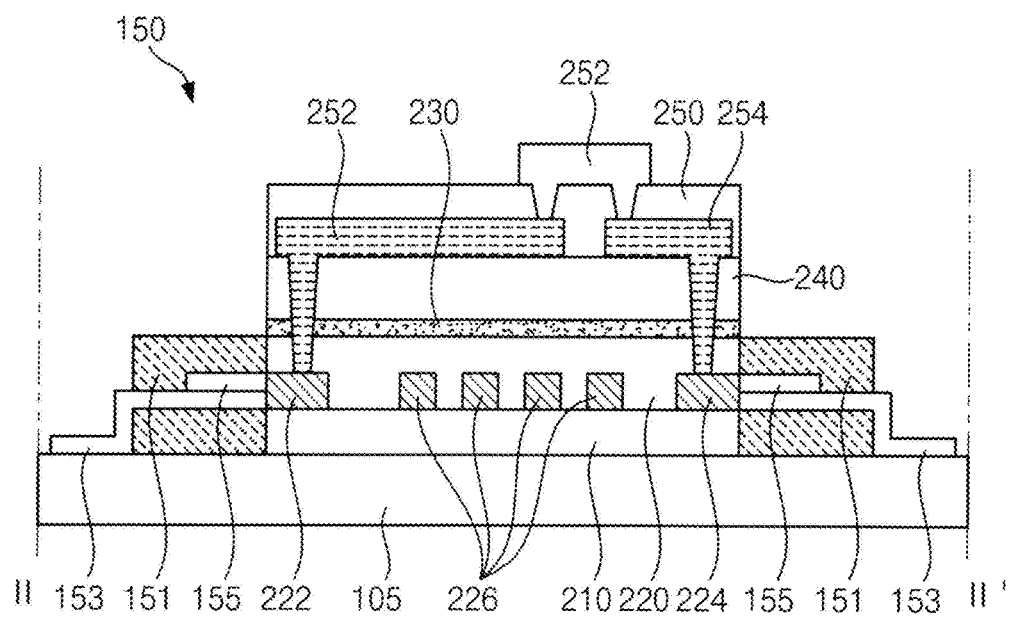
FIG. 6 is a cross-sectional view illustrating an embodiment of the display device of FIG. 1 taken along line II-II'.

FIG. 6 is a cross-sectional view illustrating an embodiment of the display device of FIG. 1 taken along line II-II';

Referring to FIG. 6, the connection structure 150 may include a first insulating layer 210, a second insulating layer 220, a first lower connection electrode 222, a signal electrode 226, a shielding layer 230, a third insulating layer 240, a fourth insulating layer 250, a first upper connection electrode 252, and a second upper connection electrode 254. The touch driver TD may be disposed on the connection structure 150. The connection structure 150 may be connected to the base substrate 105 by the accessing part 151.

In an embodiment, the first to fourth insulating layers 210, 220, 240, 250 may include an insulating material. In an embodiment, the first to fourth insulating layers 210, 220, 240, 250 may include silicon dioxide, silicon nitride, barium strontium, barium titanate, or a combination thereof as a inorganic material, for example. In an embodiment, the first to fourth insulating layers 210, 220, 240, 250 may include polyvinyl alcohol ("PVA"), polyvinyl phenol ("PVP"), polymethylmethacrylate ("PMMA") and polyimide ("PI") or a combination thereof as an organic material, for example.

The first lower connection electrode 222, the second lower connection electrode 224, and the signal electrode 226 may be disposed on the first insulating layer 210. The accessing part 151 may connect the first lower connection electrode 222 and the first touch line TL1, and connect the second lower connection electrode 224 and the second touch line TL2. The signal electrode 226 may be connected to the second signal line SL2.

In an embodiment, the accessing part 151 may include a connector. The accessing part 151 may include a first accessing terminal 153 and a second accessing terminal 155. The first accessing terminal 153 may be connected to the first touch line TL1 and the second touch line TL2. The second accessing terminal 155 may be connected to the first lower connection electrode 222 and the second lower connection electrode 224.

The second insulating layer 220 may be disposed on the first insulating layer 210 to cover the first lower connection electrode 222, the second lower connection electrode 224 and the signal electrode 226.

The shielding layer 230 may be disposed on the second insulating layer 220. The shielding layer 230 may serve to shield interference received by the signal electrode 226 from signals transmitted by the first touch line TL1 and the second touch line TL2. In an embodiment, the shielding layer 230 may include a polymer film, for example. In an embodiment, the shielding layer 230 may include an electromagnetic interference ("EMI") shielding paste, for example. In an alternative embodiment, the shielding layer 230 may include polyimide ("PI"). In addition, the shielding layer 230 may include various materials capable of preventing interference by the signal electrode 226. A third insulating layer 240 may be disposed on the shielding layer 230.

The first upper connection electrode 252 and the second upper connection electrode 254 may be disposed on the third insulating layer 240. The first upper connection electrode 252 may be connected to the first lower connection electrode 222 through a contact hole. The second upper connection electrode 254 may be connected to the second lower connection electrode 224 through a contact hole.

The fourth insulating layer 250 may be disposed on the third insulating layer 240 to cover the first upper connection electrode 252 and the second upper connection electrode 254.

In an embodiment, the touch driver TD may be disposed on the third insulating layer 240. The touch driver TD may be connected to the first upper connection electrode 252 and the second upper connection electrode 254 through a contact hole. Accordingly, interference received by the signal electrode 226 from the signal transmitted from the touch sensing layer TSL may be minimized.

In an embodiment, the touch driver TD may be disposed within the connection structure 150. In an embodiment, the touch driver TD may be disposed on the third insulating layer 240, for example. The touch driver TD may be connected to the first upper connection electrode 252 and the second upper connection electrode 254 on the third insulating layer 240.

In this way, a signal transmitted from the touch sensing layer TSL by the connection structure 150 may bypass the signal electrode 226 and be transmitted to the touch driver TD.

Figure 7:
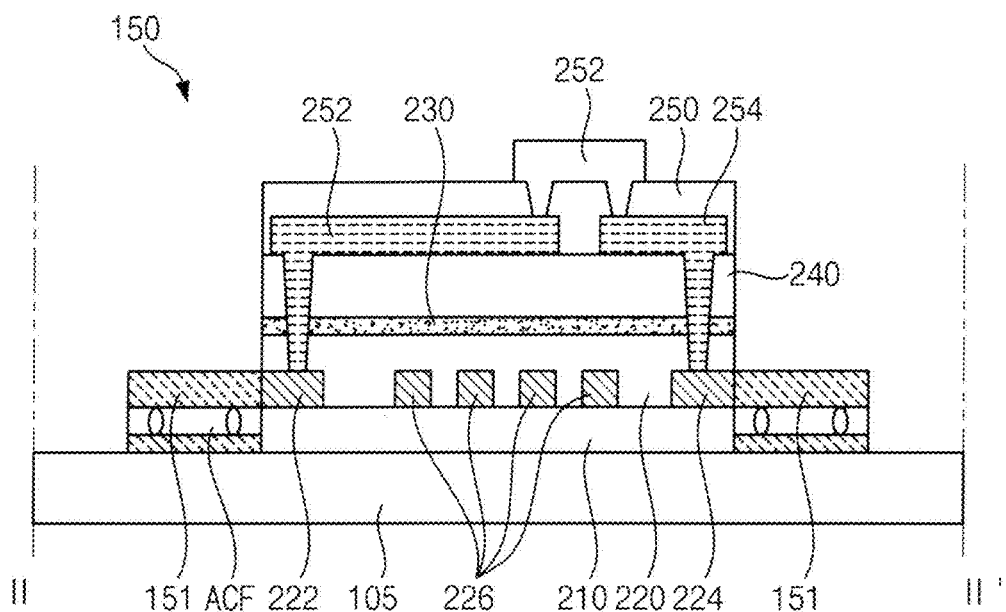
FIG. 7 is a cross-sectional view illustrating an embodiment of the display device of FIG. 1 taken along line II-II'.

FIG. 7 is a cross-sectional view illustrating an embodiment of the display device of FIG. 1 taken along line II-II'. FIG. 7 may be substantially the same as that of FIG. 6 except for the structure of the accessing part 151. Therefore, a description of the overlapping configuration will be omitted.

Referring to FIG. 7, the accessing part 151 may include an anisotropic conductive film ACF. The connection structure 150 may be connected to the base substrate 105 by the accessing part 151. The accessing part 151 may connect the connection structure 150 and the touch sensing layer TSL through an anisotropic conductive film ACF. In an embodiment, the first lower connection electrode 222 may be connected to the first touch line TL1 by the anisotropic conductive film ACF, for example. The second lower connection electrode 224 may be connected to the second touch line TL2 by the anisotropic conductive film ACF.

Figure 8:
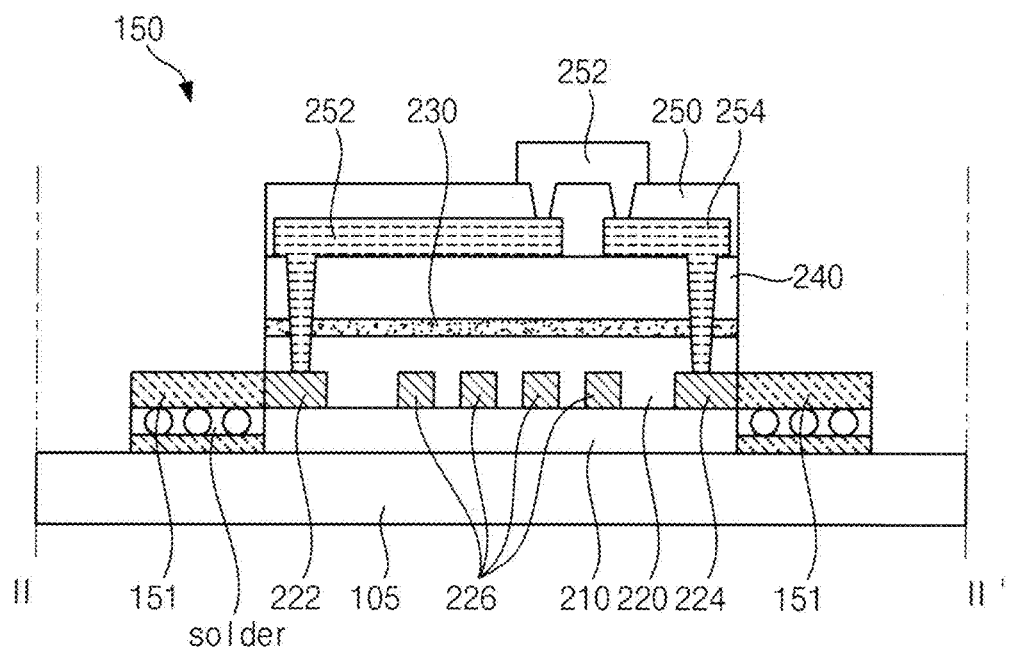
FIG. 8 is a cross-sectional view illustrating an embodiment of the display device of FIG. 1 taken along line II-II'.

FIG. 8 is a cross-sectional view illustrating an embodiment of the display device of FIG. 1 taken along line II-II'. FIG. 8 may be substantially the same as that of FIG. 6 except for the structure of the accessing part 151. Therefore, a description of the overlapping configuration will be omitted.

Referring to FIG. 8, the accessing part 151 may connect the base substrate 105 and the connection structure 150 by a surface mount technology. In an embodiment, the accessing part 151 may include solder. The accessing part 151 may connect the base substrate 105 and the connection structure 150 by a soldering technology. In an embodiment, the soldering technology may include reflow soldering technology, flow soldering technology, and the like, for example.

In this way, by bypassing the first and second touch lines TL1 and TL2 through the connection structure 150, the interference caused by the second signal line SL2 to the first and second touch lines TL1 and TL2 may be minimized.

Figure 9:
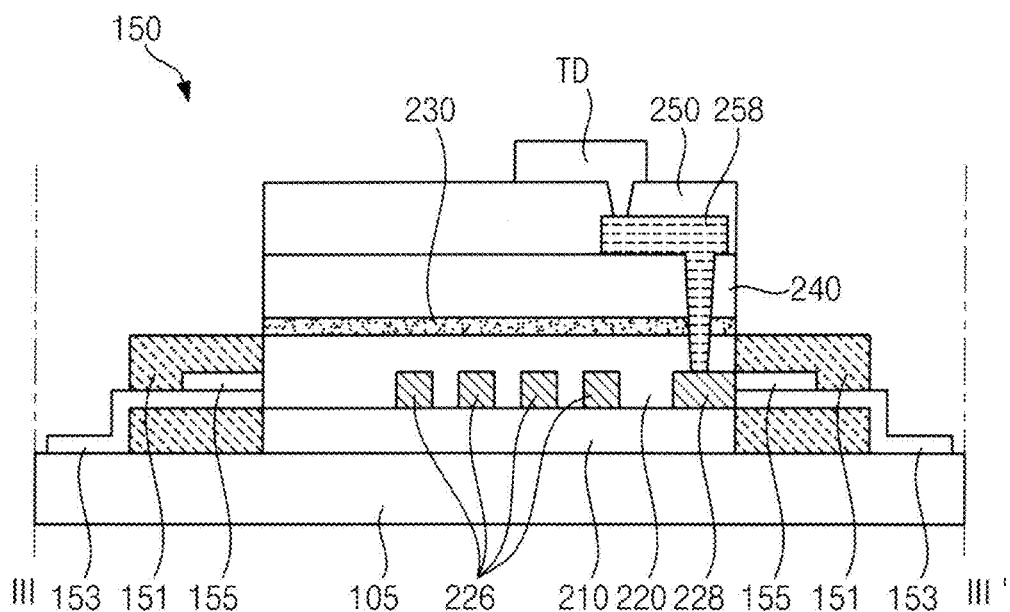
FIG. 9 is a cross-sectional view illustrating an embodiment of the display device of FIG. 1 taken along line III-III'.

FIG. 9 is a cross-sectional view illustrating an embodiment of the display device of FIG. 1 taken along line FIG. 9 may be substantially the same as FIG. 6 except for connection electrodes. Therefore, a description of the overlapping configuration will be omitted.

Referring to FIG. 9, the connection structure 150 may include a first insulating layer 210, a second insulating layer 220, a third lower connection electrode 228, a signal electrode 226, a shielding layer 230, a third insulating layer 240, a fourth insulating layer 250, and a third upper connection electrode 258. The touch driver TD may be disposed on the connection structure 150. The connection structure 150 may be connected to the base substrate 105 by the accessing part 151. In an embodiment, the touch driver TD may be disposed within the connection structure 150.

The third lower connection electrode 228 may be disposed on the first insulating layer 210. The third lower connection electrode 228 may be connected to the accessing part 151. The third lower connection electrode 228 may be disposed to be spaced apart from the second lower connection electrode 224 of FIG. 6.

The third lower connection electrode 228 may be connected to the third touch line TL3 by the accessing part 151. That is, the third lower connection electrode 228 may be connected to the external device (e.g., a central processor).

The third upper connection electrode 258 may be disposed on the third insulating layer 240. The third upper connection electrode 258 may be connected to the third lower connection electrode 228 through a contact hole. The third upper connection electrode 258 may receive a signal provided by the external device through the third lower connection electrode 228.

The touch driver TD may be connected to the third upper connection electrode 258 through a contact hole. The touch driver TD may receive a signal provided by the external device through the third upper connection electrode 258.

Figure 10:
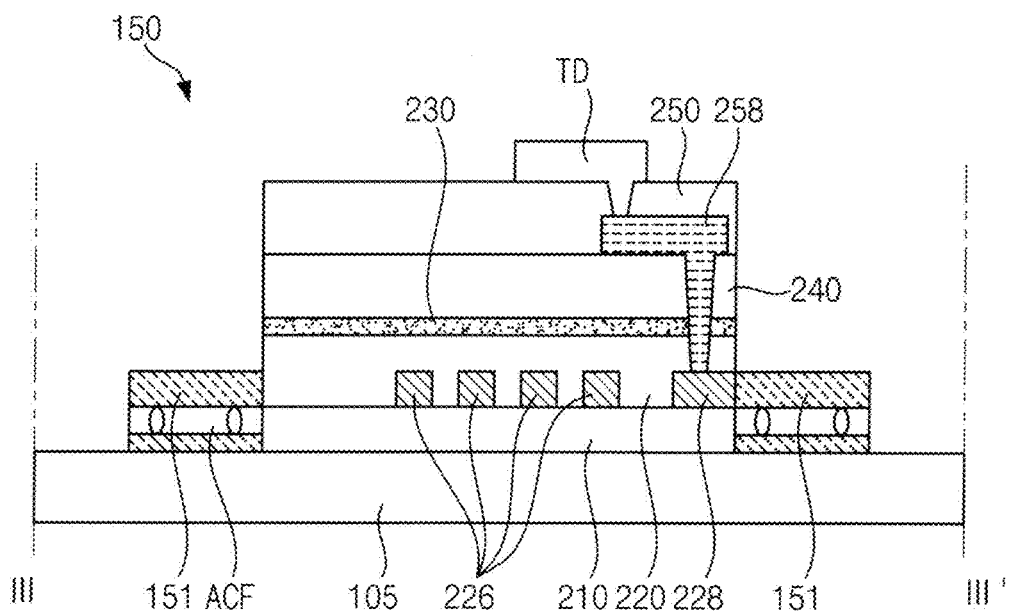
FIG. 10 is a cross-sectional view illustrating an embodiment of the display device of FIG. 1 taken along line III-III'.

FIG. 10 is a cross-sectional view illustrating an embodiment of the display device of FIG. 1 taken along line FIG. 10 may be substantially the same as FIG. 7 except for connection electrodes. Therefore, a description of the overlapping configuration will be omitted.

Referring to FIG. 10, the connection structure 150 may include a first insulating layer 210, a second insulating layer 220, a third lower connection electrode 228, a signal electrode 226, a shielding layer 230, a third insulating layer 240, a fourth insulating layer 250 and a third upper connection electrode 258. The touch driver TD may be disposed on the connection structure 150. The connection structure 150 may be connected to the base substrate 105 by the accessing part 151. In an embodiment, the touch driver TD may be disposed within the connection structure 150.

The third lower connection electrode 228 may be disposed on the first insulating layer 210. The third lower connection electrode 228 may be connected to the accessing part 151. The third lower connection electrode 228 may be disposed to be spaced apart from the second lower connection electrode 224 of FIG. 6.

The third lower connection electrode 228 may be connected to the third touch line TL3 by the accessing part 151. That is, the third lower connection electrode 228 may be connected to the external device.

The third upper connection electrode 258 may be disposed on the third insulating layer 240. The third upper connection electrode 258 may be connected to the third lower connection electrode 228 through a contact hole. The third upper connection electrode 258 may receive a signal provided by the external device through the third lower connection electrode 228.

The touch driver TD may be connected to the third upper connection electrode 258 through a contact hole. The touch driver TD may receive a signal provided by the central processor through the third upper connection electrode 258.

Figure 11:
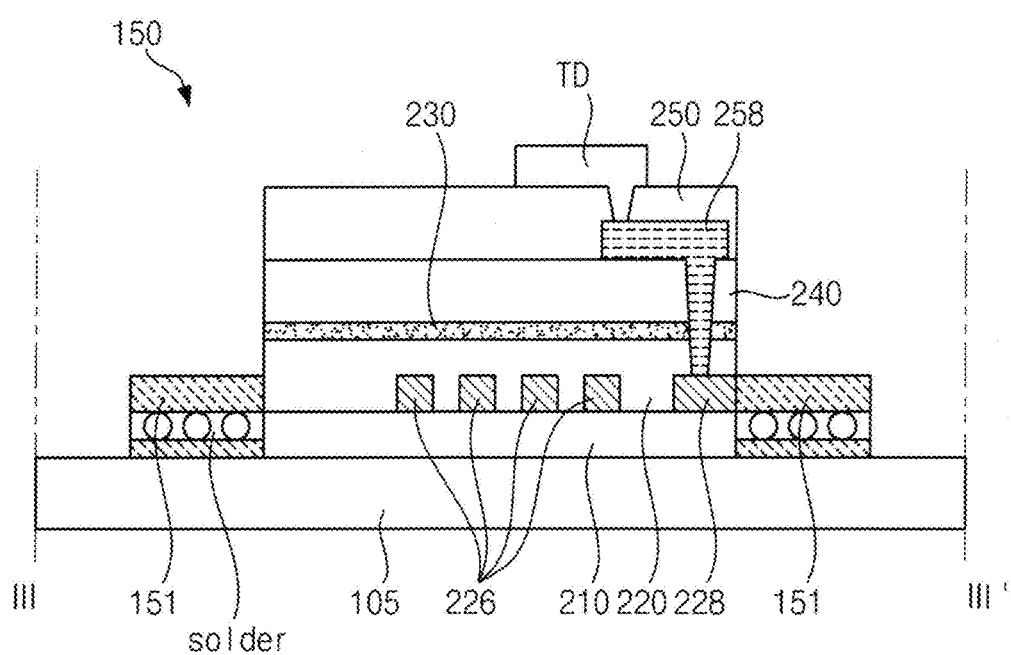
FIG. 11 is a cross-sectional view illustrating an embodiment of the display device of FIG. 1 taken along line III-III'.

FIG. 11 is a cross-sectional view illustrating an embodiment of the display device of FIG. 1 taken along line FIG. 11 may be substantially the same as FIG. 8 except for connection electrodes. Therefore, a description of the overlapping configuration will be omitted.

Referring to FIG. 11, the connection structure 150 may include a first insulating layer 210, a second insulating layer 220, a third lower connection electrode 228, a signal electrode 226, a shielding layer 230, a third insulating layer 240, a fourth insulating layer 250, and a third upper connection electrode 258. The touch driver TD may be disposed on the connection structure 150. The connection structure 150 may be connected to the base substrate 105 by the accessing part 151. In an embodiment, the touch driver TD may be disposed within the connection structure 150.

The third lower connection electrode 228 may be disposed on the first insulating layer 210. The third lower connection electrode 228 may be connected to the accessing part 151. The third lower connection electrode 228 may be disposed to be spaced apart from the second lower connection electrode 224 of FIG. 6.

The third lower connection electrode 228 may be connected to the third touch line TL3 by the accessing part 151. That is, the third lower connection electrode 228 may be connected to the central processor.

The third upper connection electrode 258 may be disposed on the third insulating layer 240. The third upper connection electrode 258 may be connected to the third lower connection electrode 228 through a contact hole. The third upper connection electrode 258 may receive a signal provided by the central processor through the third lower connection electrode 228.

The touch driver TD may be connected to the third upper connection electrode 258 through a contact hole. The touch driver TD may receive a signal provided by the central processor through the third upper connection electrode 258.

As described above, since the third touch line TL3 is bypassed through the connection structure 150, interference due to the second signal line SL2 to the third touch line TL3 may be minimized.

Figure 12:
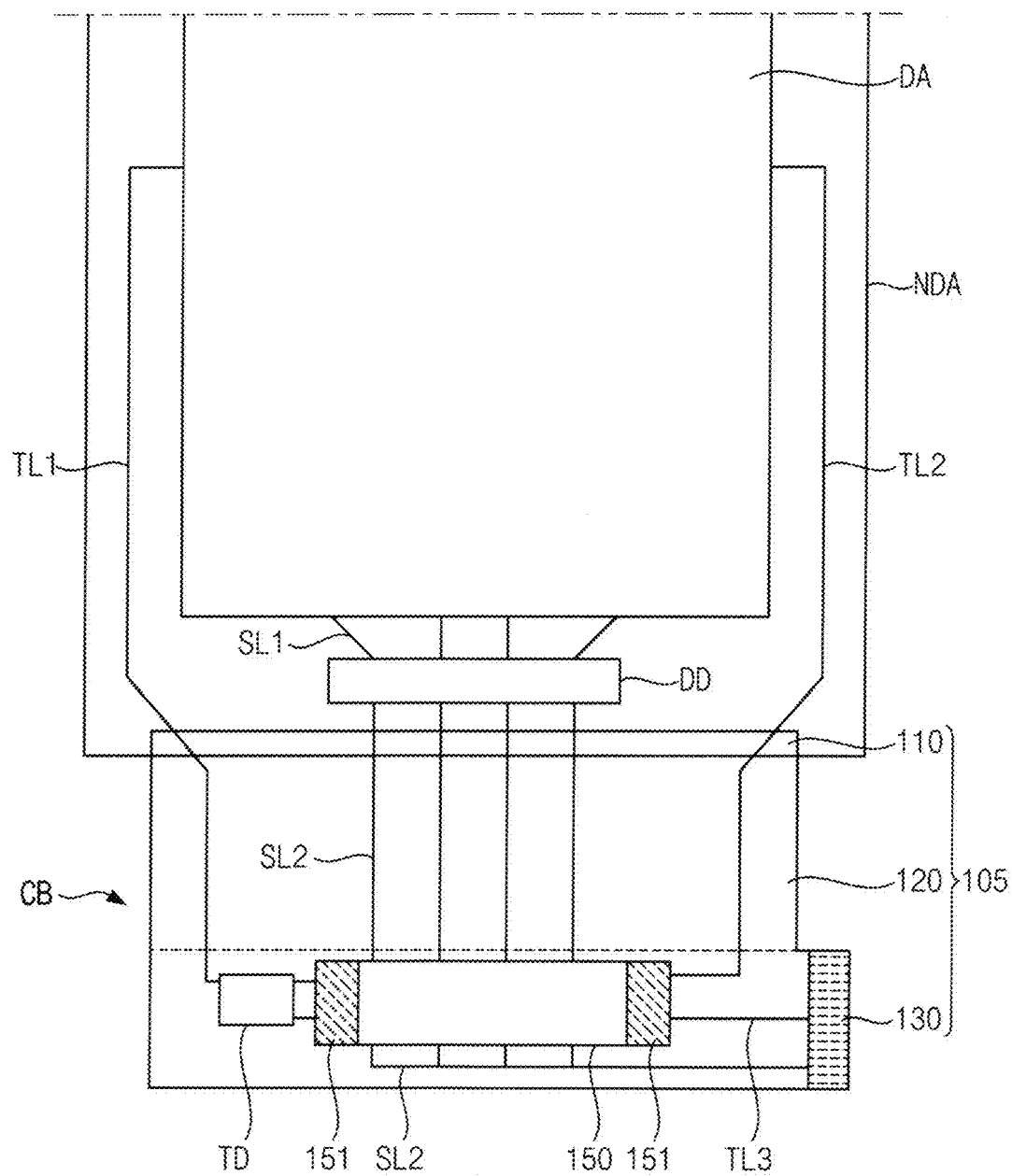
FIG. 12 is a plan view illustrating an embodiment of a display device according to the invention.
Figure 13:
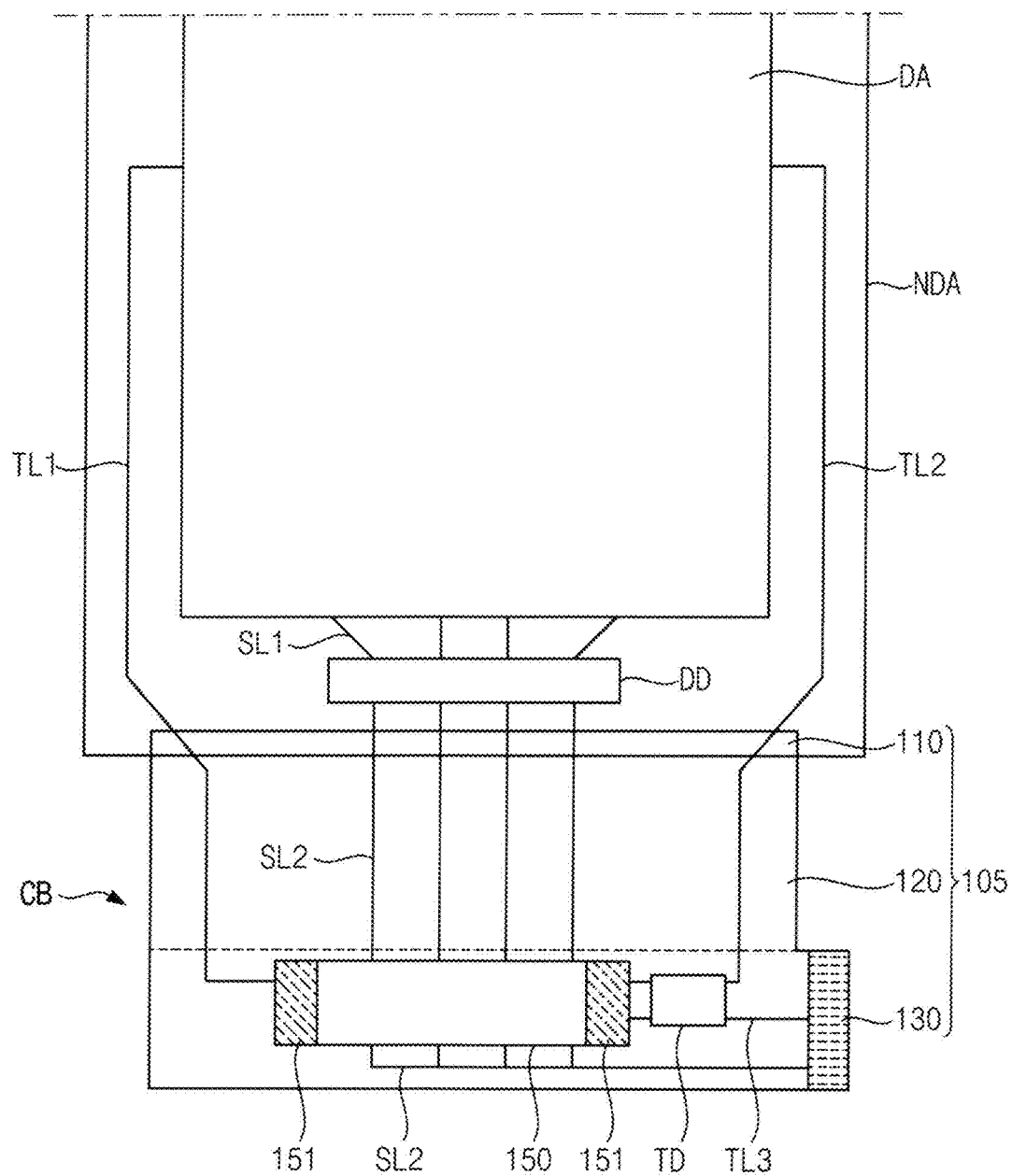
FIG. 13 is a plan view illustrating an embodiment of a display device according to the invention.

FIG. 12 is a plan view illustrating an embodiment of a display device according to the invention, and FIG. 13 is a plan view illustrating an embodiment of a display device according to the invention. FIGS. 12 and 13 may be substantially the same as that of FIG. 1 except for a location where the touch driver is disposed. Therefore, a description of the overlapping configuration will be omitted.

Referring to FIG. 12, the touch driver TD may be disposed on the base substrate 105. The touch driver TD may be connected to the second touch line TL2 and the third touch line TL3 bypassed through the connection structure 150. The touch driver TD may be connected to the first touch line TL1 without the connection structure 150.

Referring to FIG. 13, the touch driver TD may be disposed on the base substrate 105. The touch driver TD may be connected to the second touch line TL2 and the third touch line TL3 without the connection structure 150. The touch driver TD may be connected to the first touch line TL1 bypassed through the connection structure 150.

In this way, by bypassing at least one of the first to third touch lines TL1, TL2, TL3 through the connection structure 150, the interference caused by the second signal line SL2 to at least one of the first to third touch lines TL1, TL2, TL3 may be minimized.

Figure 14:
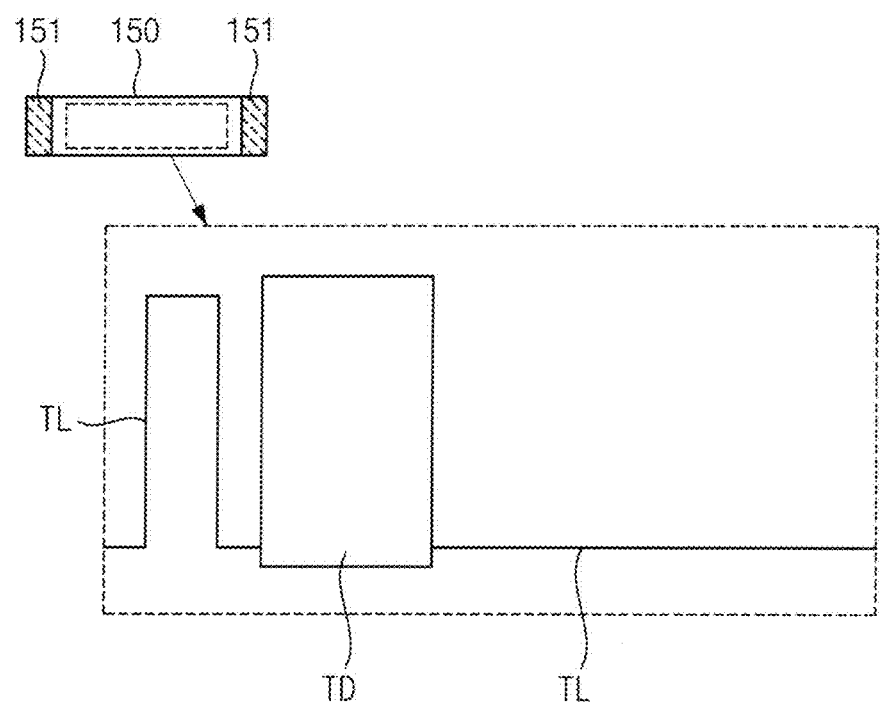
FIG. 14 is a diagram illustrating an embodiment of an interior of a connection structure included in the display device of FIG. 1.

FIG. 14 is a diagram illustrating an embodiment of an interior of a connection structure included in the display device of FIG. 1.

Referring to FIG. 14, in embodiments, opposite sides of the touch driver TD may be connected to the touch lines TL, respectively. Each of the touch lines TL may be connected to the display structure DS. In an embodiment, the touch driver TD may be disposed on one side of the connection structure 150. Accordingly, the lengths of the touch lines TL disposed on both sides of the touch driver TD may be different. In this case, the same signal flowing through the touch lines TL disposed on both sides may not be simultaneously transmitted to the display structure DS. In an alternative embodiment, the touch signal may not be accurately transmitted due to a phase difference between the alternating current ("AC") type touch signals. Accordingly, the touch line TL disposed on at least one side may have a meander shape, so that the length of the touch lines TL disposed on both sides may be substantially the same.

Embodiments of the invention should not be construed as being limited to the embodiments set forth herein. Rather, these embodiments are provided so that this invention will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention.

What is claimed is:

1. A circuit board comprising:
a base substrate separate from and configured to connect to a display panel; and
a connection structure disposed on the base substrate, and connected to the base substrate by an accessing part, the connection structure including:
a first connection electrode disposed in a first layer;
a second connection electrode disposed in the first layer;
a third connection electrode connected to the first connection electrode and disposed on the first connection electrode, and disposed in a second layer;
a fourth connection electrode connected to the second connection electrode and disposed on the second connection electrode, and disposed in the second layer, and
a signal electrode disposed in the first layer,
wherein the signal electrode is connected to a signal line, which transmits a signal from the base substrate to the display panel to display an image on the display panel,
wherein the display panel includes a touch sensing layer disposed thereon,
wherein the touch sensing layer is connected to the first connection electrode by a first touch line, and is connected to the second connection electrode by a second touch line, and
wherein at least one of the first touch line and the second touch line includes a resistance value increasing portion, and the resistance value increasing portion has a meander shape.

2. The circuit board of claim 1, wherein the accessing part is connected to the base substrate by a surface mount technology.

3. The circuit board of claim 1, wherein the accessing part is connected to the base substrate by a solder.

4. The circuit board of claim 1, wherein the accessing part is connected to the base substrate by a connector.

5. The circuit board of claim 1, wherein the accessing part is connected to the base substrate by an anisotropic conductive film.

6. The circuit board of claim 1, wherein the connection structure further includes:
a fifth connection electrode disposed in the first layer; and
a sixth connection electrode connected to the fifth connection electrode on the fifth connection electrode.

7. The circuit board of claim 1, further comprising:
a touch driver disposed on the connection structure and connected to the connection structure.

8. The circuit board of claim 1, further comprising:
a touch driver disposed on the base substrate and connected to the connection structure.

9. The circuit board of claim 1, wherein the connection structure further includes a shielding layer disposed between a layer on which the first connection electrode and the second connection electrode are disposed and a layer on which the third connection electrode and the fourth connection electrode are disposed.

10. A display device comprising:
a display structure; and
a circuit board separate from and connected to the display structure, the circuit board including:
a base substrate; and
a connection structure disposed on the base substrate, and connected to the base substrate by an accessing part, the connection structure including:
a first connection electrode disposed in a first layer;
a second connection electrode disposed in the first layer;
a third connection electrode connected to the first connection electrode and disposed on the first connection electrode, and disposed in a second layer;
a fourth connection electrode connected to the second connection electrode and disposed on the second connection electrode, and disposed in the second layer, and
a signal electrode disposed in the first layer,
wherein the signal electrode is connected to the display structure to display an image,
wherein the display structure further includes:
a display substrate including a display area and a non-display area surrounding the display area;
a display panel disposed on the display substrate; and
a touch sensing layer disposed on the display panel, and including a sensor electrode,
wherein the touch sensing layer is connected to the first connection electrode by a first touch line, and is connected to the second connection electrode by a second touch line, and wherein at least one of the first touch line and the second touch line includes a resistance value increasing portion, and the resistance value increasing portion has a meander shape.

11. The display device of claim 10, wherein the connection structure further includes:
a fifth connection electrode disposed in the same first layer; and
a sixth connection electrode connected to the fifth connection electrode on the fifth connection electrode.

12. The display device of claim 11, further comprising:
a central processor connected to the circuit board, and
wherein the central processor is connected to the fifth connection electrode by a touch line.

13. The display device of claim 10, wherein the accessing part is connected to the base substrate by a surface mount technology.

14. The display device of claim 10, wherein the accessing part is connected to the base substrate by a solder.

15. The display device of claim 10, wherein the accessing part is connected to the base substrate by a connector.

16. The display device of claim 10, wherein the accessing part is connected to the base substrate by an anisotropic conductive film.

* * * * *